(12) United States Patent
Iino

(10) Patent No.: US 6,545,493 B1
(45) Date of Patent: Apr. 8, 2003

(54) HIGH-SPEED PROBING APPARATUS

(75) Inventor: Shinji Iino, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/659,732

(22) Filed: Sep. 11, 2000

(30) Foreign Application Priority Data

Sep. 29, 1999 (JP) .......................................... 11-277358

(51) Int. Cl.$^7$ ................................................ G01R 31/00
(52) U.S. Cl. ..................... 324/754; 324/158.1; 324/758
(58) Field of Search ............................... 324/754, 755, 324/758, 158.1, 763, 762, 761, 765; 439/482, 66

(56) References Cited

U.S. PATENT DOCUMENTS

| | | | | |
|---|---|---|---|---|
| 4,862,075 A | * | 8/1989 | Choi et al. ................ | 324/158.1 |
| 5,410,259 A | * | 4/1995 | Fujihara et al. ............. | 324/758 |
| 5,461,327 A | * | 10/1995 | Shibata et al. ............... | 324/760 |
| 5,517,126 A | * | 5/1996 | Yamaguchi ................ | 324/758 |
| 5,521,523 A | * | 5/1996 | Kimura et al. ............... | 324/760 |
| 5,559,446 A | * | 9/1996 | Sano .......................... | 324/760 |
| 5,610,529 A | * | 3/1997 | Schwindt .................... | 324/760 |
| 5,982,183 A | * | 11/1999 | Sano .......................... | 324/754 |
| 6,111,421 A | * | 8/2000 | Takahashi et al. .......... | 324/758 |
| 6,181,145 B1 | * | 1/2001 | Tomita et al. ............... | 324/754 |
| 6,275,052 B1 | * | 8/2001 | Hembree et al. ........... | 324/754 |
| 6,380,755 B1 | * | 4/2002 | Sato ........................... | 324/754 |

* cited by examiner

Primary Examiner—Kamand Cuneo
Assistant Examiner—Jimmy Nguyen
(74) Attorney, Agent, or Firm—Oblon, Spivak, McClelland, Maier & Neustadt, P.C.

(57) ABSTRACT

A probing apparatus is adapted for high-speed measurement and used for inspecting the electric characteristics of an object under inspection. The probing apparatus is provided with a probing apparatus main body, a contactor arranged inside the probing apparatus main body, pin electronics including a plurality of electronic circuits and arranged in a transmission line that is provided for transmission of inspection signals between the contactor and a tester located outside the probing apparatus, the electronic circuits being made of at least one integrated circuit, an interposer for electrically connecting the pin electronics and the contactor together, and a cooling unit for cooling the pin electronics.

11 Claims, 4 Drawing Sheets

HIGH-SPEED PROBING APPARATUS

CROSS-REFERENCE TO RELATED APPLICATIONS

This application is based upon and claims the benefit of priority from the prior Japanese Patent Application No. 11-277358, filed Sep. 29, 1999, the entire contents of which are incorporated herein by reference.

BACKGROUND OF THE INVENTION

The present invention relates to a high-speed probing apparatus, more specifically to a probing apparatus capable of inspecting a high-speed device operated in the frequency range of not less than 1 GHz.

A conventional probing apparatus comprises a mechanism for conveying a wafer or a similar type of object, a loading chamber where the wafer is pre-aligned during the conveyance step of the wafer, and a probing chamber for inspecting the electric characteristics of the wafer when this wafer is supplied from the loading chamber. Inside the loading chamber, a tweezers and a sub-chuck are arranged, which serve as a wafer conveyance mechanism and a pre-alignment mechanism, respectively. When the wafer is conveyed by the tweezers, the sub-chuck pre-aligns the wafer, using the orientation flat of the wafer as a reference. Inside the probing chamber, a main chuck and an alignment mechanism are arranged. With the wafer held thereon, the main chuck cooperates with the alignment mechanism and moves in the X-, Y-, Z- and θ-directions. By this movement, the wafer W is aligned with the probing needles of a probe card located above the main chuck. After being aligned in this manner, the wafer W is moved up in the Z direction until the probing needles are brought into electric contact with IC-measuring electrodes formed on the wafer. With a test head being in contact with the electrodes through the probing needles, the electric characteristics of the ICs are inspected.

The test head is provided with a pin electronics. The pin electronics comprise a driver section, a comparator section and a dynamic loader section. A pattern generator generates test pattern signals under the control by a tester (not shown). The pin electronics also serve as an interface through which the test pattern signals and test result pattern signals (received from the device) are exchanged between the tester and the probe card.

The probe card is detachably attached to a performance board fixed to the head plate of the probing chamber. The probe card is provided with a plurality of probes serving as contactors, and a printed circuit board supporting the probes and connected to them. Probe cards of a number of types are prepared and are selectively used in accordance with the types of wafers.

BRIEF SUMMARY OF THE INVENTION

In the conventional probing apparatus, a performance board, a pogo-pin ring, and a probe card main body are located between the pin electronics and the probe. With this structure, the transmission line between the pin electronics and the probe is inevitably long. Due to this, test pattern signals of a frequency of 1 GHz or higher cannot be transmitted accurately or at high speed. The conventional probing apparatus cannot inspect high-speed devices in actuality.

In the case where the conventional probing apparatus is used for inspecting a high-speed device that is operated in a GHz band, the impedance of a probe or the like cannot be easily matched. In addition, if the wire length of the transmission line is 3 mm or more, the problem caused by noise becomes too serious to reliably inspect the device.

Where the transmission line is formed of a dielectric material, such as a ceramic material (permittivity ∈: about 4), and is as long as 50 mm, the signal rise time is 2 nano-seconds. Let us assume that the pin electronics have an impedance matched to 50 Ω in a GHz band. In this case, the problem of noise begins to become serious if the transmission line is longer than 25 mm or so. In the conventional pin electronics, however, it is practically impossible to provide a transmission line that is shorter than 25 mm.

In the conventional probing apparatus, wherein the pin electronics are built in a test head, the transmission line between the pin electronics and the probe is long, as described above. Due to this structure, high-speed devices cannot be inspected. Even if the performance board, the pogo-pin ring and the probe card are omitted, and the probe is connected directly to the pin electronics, this structure does not solve a problem regarding the loss in the transmission line. That is, a device having a large number of pins and operated in a GHz band cannot be reliably inspected by use of the pin electronics of the current size.

The present invention has been made to solve the above problems.

The present invention is intended to provide a probing apparatus adapted for high-speed measurement and enabling reliable inspection of a device operated in a GHz band.

According to the first aspect of the present invention, there is provided a probing apparatus adapted for high-speed measurement and used for inspecting the electric characteristics of an object under inspection, the probing apparatus comprising:

a probing apparatus main body;

a contactor arranged inside the probing apparatus main body;

a pin electronics including a plurality of electronic circuits and arranged in a transmission line that is provided for transmission of inspection signals between the contactor and a tester located outside the probing apparatus, the electronic circuits being made of at least one integrated circuit;

an interposer for electrically connecting the pin electronics and the contactor together; and cooling means for cooling the pin electronics.

Preferably, the electronic circuits of the pin electronics of the probing apparatus include a control section, a comparator section and a driver section, and these sections are made of at least one integrated circuit.

Preferably, the pin electronics of the probing apparatus comprise an upper package and a lower package, and the cooling means thereof is arranged between peripheral portions of the upper and lower packages.

Preferably, the interposer of the probing apparatus includes contact pins that are projected from both sides thereof.

Preferably, the driver section of the pin electronics of the probing apparatus are made of at least one integrated circuit and is located closer to the cooling means than the other circuit sections.

Preferably, the comparator section of the pin electronics of the probing apparatus is made of at least one integrated circuit and is located closer to the interposer than the other circuit sections.

According to the second aspect of the present invention, there is provided a probing apparatus adapted for high-speed measurement and used for inspecting the electric characteristics of an object under inspection, the probing apparatus comprising:

a probing apparatus main body;

a contactor arranged inside the probing apparatus main body;

a pin electronics including a plurality of electronic circuits and arranged in a transmission line that is provided for transmission of inspection signals between the contactor and a tester located outside the probing apparatus, the electronic circuits being made of at least one integrated circuit;

a pattern generator including an electronic circuit and used for generating inspection signals;

an interface board for electrically connecting the pattern generator and the pin electronics together;

cooling means for cooling the pin electronics.

Preferably, the electronic circuit of the pattern generator of the probing apparatus are is made of at least one integrated circuit.

Preferably, the electronic circuits of the pin electronics of the probing apparatus include a control section, a comparator section and a driver section, and these sections are made of at least one integrated circuit.

Preferably, the driver section of the pin electronics of the probing apparatus is made of at least one integrated circuit and is located closer to the cooling means than the other circuit sections.

Preferably, the comparator section of the pin electronics of the probing apparatus is made of at least one integrated circuit and is located closer to the interposer than the other circuit sections.

Preferably, the interposer of the probing apparatus includes contact pins that are projected from both sides thereof.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

The present invention will be described, referring to the embodiments shown in FIGS. 1 to 8B.

A probing apparatus 10 according to one embodiment is a type adapted for high-speed measurement (which will be hereinafter referred to as a "high-speed probing apparatus"). As can be seen from FIG. 1, the high-speed probing apparatus 10 is featured in that (i) a test head, a performance board, a pogo-pin ring, and a probe card, which are used in the conventional art, are omitted, (ii) a transmission line is not employed between pin electronics and a device, and (iii) a short transmission line is provided for the pin electronics.

Figure 1:
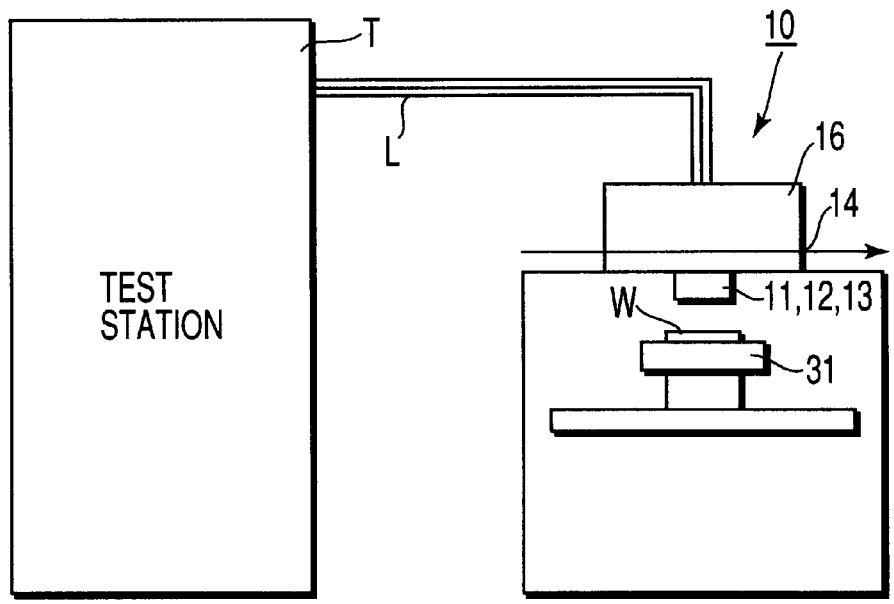
FIG. 1 a conceptual diagram showing how a high-speed probing apparatus according to one embodiment of the present invention is related to a tester.
Figure 2:
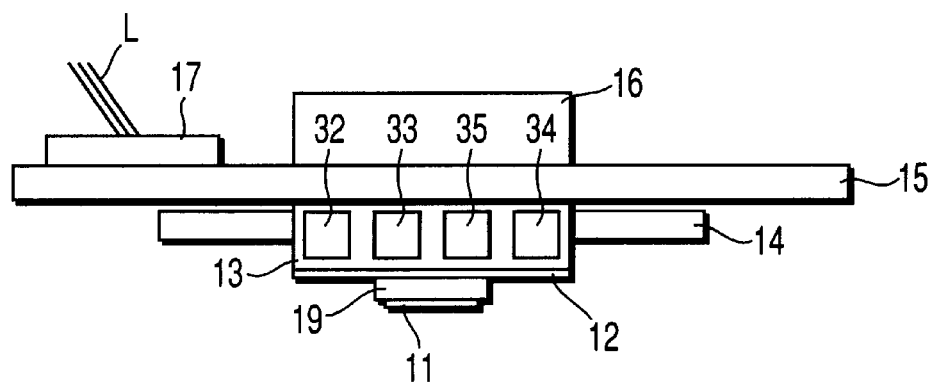
FIG. 2 shows the structure of the major portion of the high-speed probing apparatus depicted in FIG. 1.

As shown in FIGS. 1 and 2, the high-speed probing apparatus 10 comprises: a replaceable contactor 11 which is brought into contact with a plurality of inspection electrode pads of devices formed on an object under inspection (e.g., a wafer); a pin electronics 13 having a plurality of electronic circuits made of one or more integrated circuits; an interposer 12 which connects the contactor 11 and the pin electronics 13 together; and a cooling means (e.g., a cooling jacket) 14 for cooling the pin electronics 13. The electronic circuits of the pin electronics are made of a small number of integrated circuits (desirably, the electronic circuits are made of a single integrated circuit). With this structure, the transmission line provided for the pin electronics is as short as possible.

In addition to the above structural elements, the high-speed probing apparatus 10 may comprise a pattern generator 16, and an interface board 15 for connecting the pattern generator 16 and the pin electronics 13 together. The interface board 15 is connected to a tester T by means of a signal cable line L and a connector 17.

Figure 3:
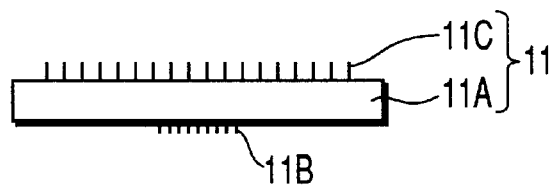
FIG. 3 is a side view of the contactor employed in the high-speed probing apparatus depicted in FIG. 2, an interposer being illustrated as well.

As shown in FIG. 3, the contactor 11 comprises a multi-layered wiring structure board 11A, a plurality of probes 11B, and a plurality of terminal needles 1C. The multi-layered wiring structure board 11A can be formed of a ceramic material which, like aluminum nitride, has a coefficient of thermal expansion close to that of a silicon wafer. The probes 11B are formed on the lower side of the multi-layered wiring structure board 11A in a matrix pattern, in such a manner that they correspond in position to the electrode pads of devices. The probes 11B may be bump elements formed in the CVD method or the like. If the probes are formed as such, it is possible to cope with future devices wherein the electrode pads are provided at short pitches. The terminal needles 11C are electrically connected to the probes 11B, respectively, and are formed on the upper side of the board 11A.

Figure 8A:
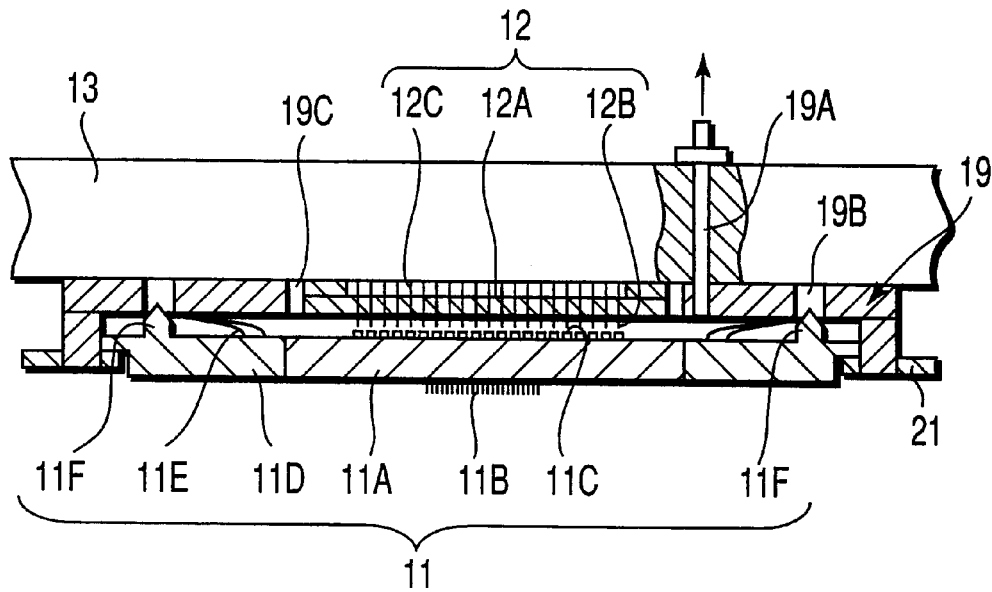
FIG. 8A is a sectional view showing how the contactor of high-speed probing apparatus is related to a holding mechanism.
Figure 8B:
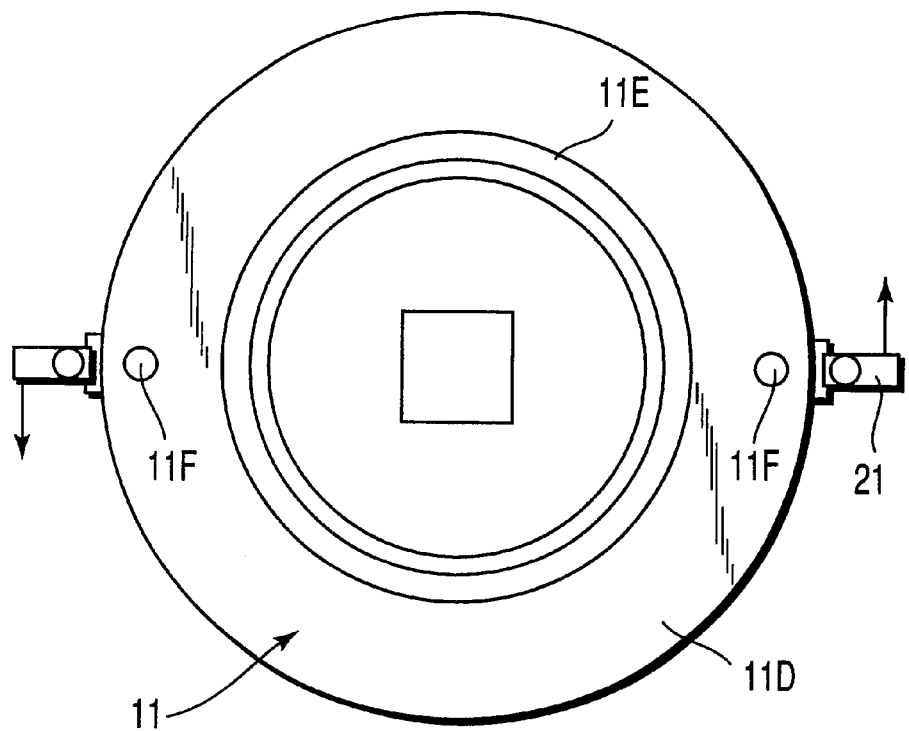
FIG. 8B is a plan view of the contactor depicted in FIG. 8A.

As shown in FIGS. 8A and 8B, the interposer 12 comprises a base board 12A, a plurality of first connection terminals 12B, and a plurality of second connection terminals 12C. Preferably, the first connection terminals 12B are arranged on the lower side of the base board 12A in a matrix pattern in such a manner that they correspond in position to the terminal needles 11C arranged on the upper surface of the contactor 11. Preferably, the second connection terminals 12C are arranged on the upper side of the base board 12A in such a manner that they correspond in position to the connection terminals 12B. The interposer 12 is replaceable in accordance with the type of the tester. A distal end portion of the contactor 11 has a length of 3 mm or less. With this structure, signals of a GHz band can be transmitted without being significantly distorted. In FIGS. 8A and 8B, the holding mechanism of the contactor 11 is illustrated as well.

The pin electronics 13 comprise a driver section 32, a comparator section 33, another driver section 34, and a dynamic loader 35 (see FIG. 2). The pin electronics 13 also comprise input pins 18C for receiving signals from the tester (for example, 12 input pins are provided per channel) (see FIG. 4B), and output pins 18D (for example, one output pin is provided per channel). The number of input and output pins is about 2,000 or so for each device. The driver sections of the pin electronics 13 convert a test pattern signal supplied from the pattern generator 16 into a voltage value, and outputs this voltage value to a device. The comparator section 33 compares a test result pattern signal supplied from the device with a reference pattern signal (an expected value). By this comparison, the comparator section 33 generates a determination signal based on which a device is evaluated. The determination signal is supplied to the tester. In the pin electronics 13, all or some of the driver sections, comparator section and dynamic loader may be formed as one VLSI, together with their input and output pins. In the case where this structure is adopted, the transmission line can be short, the signal rise time is also short, the transmission loss is small, and high-speed signals of a GHz band can be transmitted with high efficiency without being much distorted.

According to the present embodiment, the pin electronics 13 are formed as one VLSI. Instead, the pin electronics 13 can be made of different devices in accordance with the functions of the driver sections, comparator section, etc. Each of these devices can be formed as an MCM (multi-chip module).

Figure 4A:
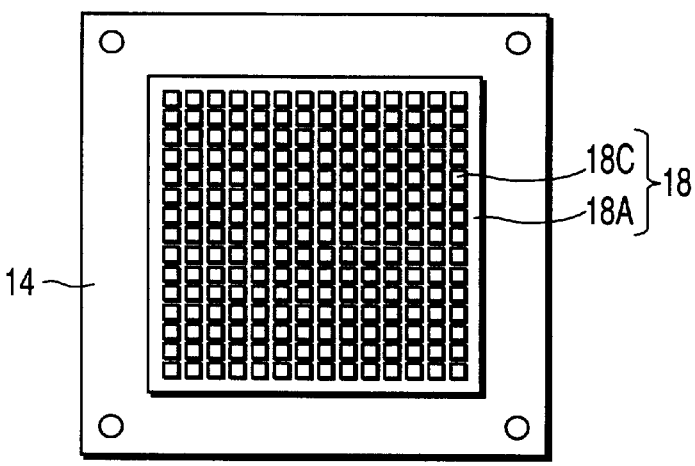
FIG. 4A is an enlarged plan view showing the upper side of the pin electronics employed in the high-speed probing apparatus depicted in FIG. 2.
Figure 4B:
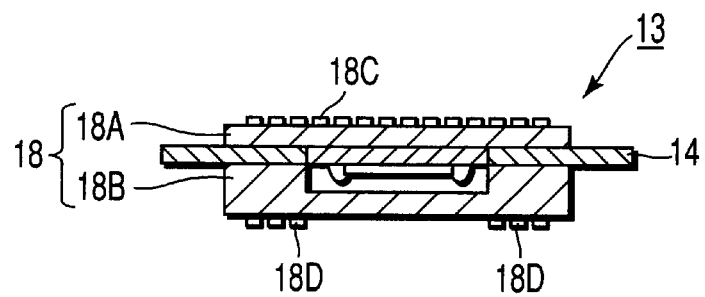
FIG. 4B is a sectional view of the pin electronics.
Figure 4C:
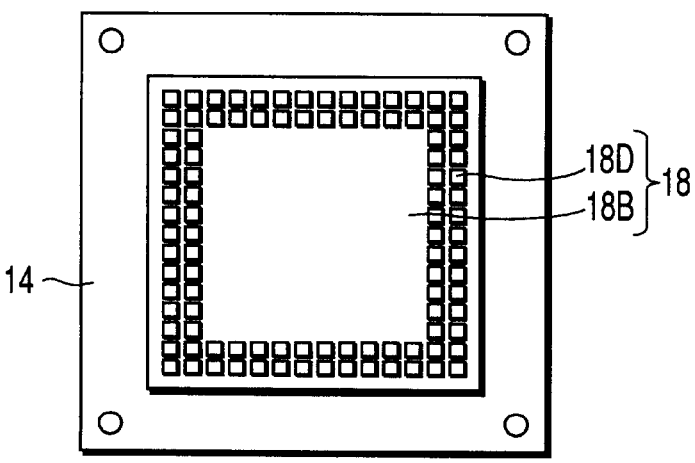
FIG. 4C is a plan view showing the lower side of the pin electronics.

As shown in FIGS. 4A–4C, the pin electronics 13 are sealed in a package 18 formed of a ceramic material or a synthetic resin (e.g., epoxy resin). The package 18, as shown in FIG. 4B, is made up of an upper package 18A and a lower package 18B. The pin electronics 13 are mounted on the lower side of the upper package 18A. On the upper side of the upper package 18A, a plurality of electrode pads 18C (e.g., 4,000 to 10,000 pads) are arranged in a matrix pattern, as shown in FIGS. 4A and 4B. The electrode pads 18C are electrically connected to the interface board 15 (see FIG. 2). AS shown FIGS. 4B and 4C, electrode pads 18D (e.g., 2,000 to 5,000 pads) are arranged on the lower side of the lower package 18B. These electrode pads 18D are located on the peripheral portions and constitute a number of rows. The electrode pads 18D are electrically connected to the second connection terminals 12C (FIGS. 8A and 8B) of the interposer 12.

The pin electronics 13 include active elements (e.g., driver sections) integrated with high density. Since a large amount of heat is generated from these elements, it is desirable that the pin electronics be cooled with the coolling jacket 14. Preferably, the coolling jacket 14 is located between the peripheral portions of the upper and lower packages 18A and 18B. The cooling jacket 14 is provided with a refrigerant passage, and the pin electronics 13 are cooled whenever inspection is carried out.

Figure 5:
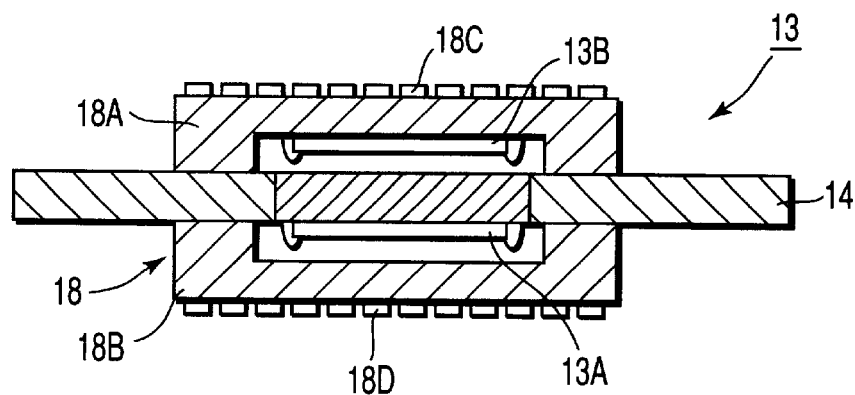
FIG. 5 is a sectional view corresponding to that of FIG. 4B and showing pin electronics employed in a high-speed being apparatus according to another embodiment of the present invention.
Figure 6:
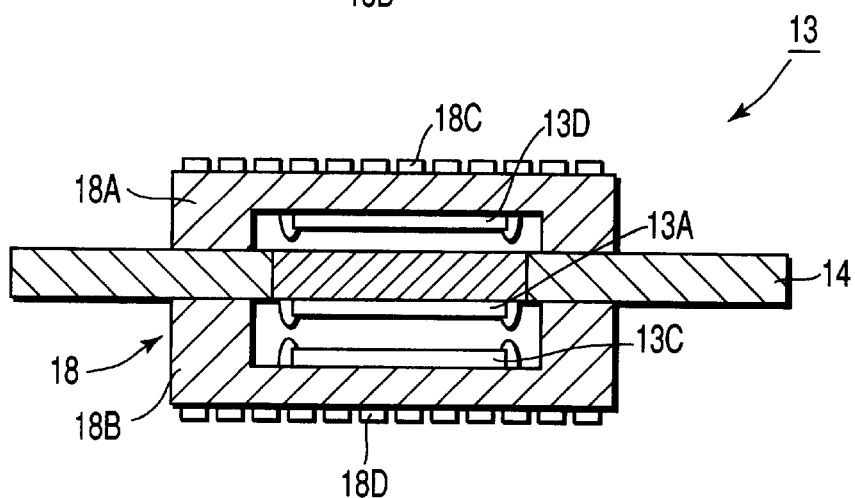
FIG. 6 is a sectional view corresponding to that of FIG. 4B and showing pin electronics employed in a high-speed probing apparatus according to still another embodiment of the present invention.
Figure 7:
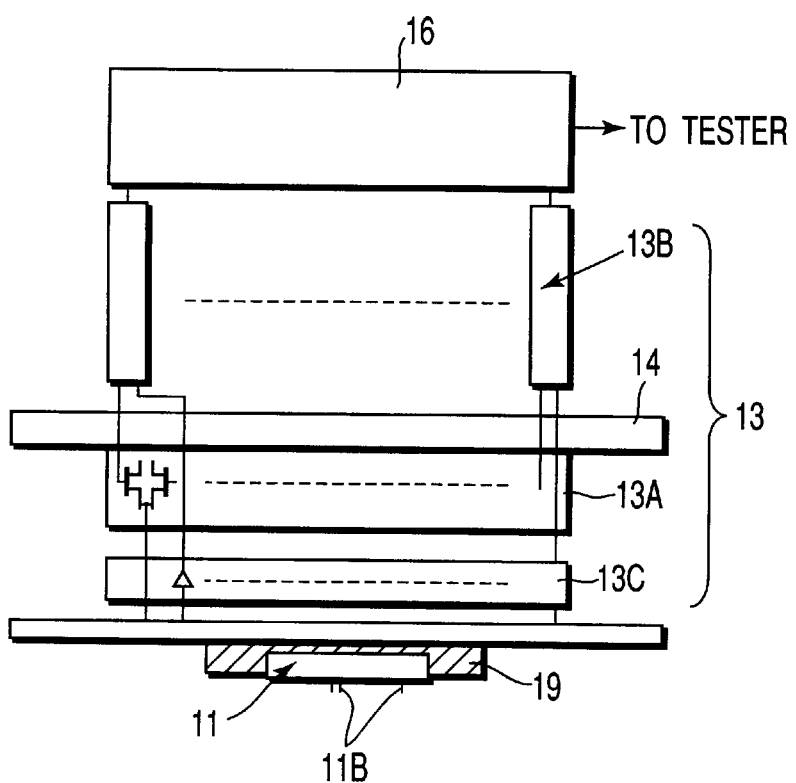
FIG. 7 is a conceptual diagram showing how signals are exchanged in the high-speed probing apparatus depicted in FIG. 6.

With reference to FIGS. 4A–4C, the pin electronics 13 were described as having a plurality of electronic circuits that are formed of a single VLSI. The pin electronics 13 may be defined by divided electronic sections, as shown in FIGS. 5 and 6. In the pin electronics 13 shown in FIG. 5, a plurality of driver sections, which generate a large amount of heat, are formed by a single integrated circuit that serves as a driver element 13A. This driver element 13A is separated from the other active element 13B, which integrates a comparator section and a control section. The driver element 13A is cooled by the cooling jacket 14. With this structure, the cooling jacket 14 intensively cools the driver element 13A, and heat is prevented from being undesirably conveyed to the control section. Accordingly, the reliability of the inspection is further enhanced. In the pin electronics 13 shown in FIG. 6, the active element 13B is divided into a comparator element 13C and a second active element 13D (which includes a control element), and these divided elements are provided in addition to the driver element 13A. The comparator element 13C is, arranged as close as possible to the contactor 11. With this structure, the high-speed transmission line between the comparator element 13C and the contactor 11 can be short. In addition, the transmission line is little affected by heat. Even if the impedance matching with reference to the probes 11B is not attained, noise and other adverse effects on test pattern signals are suppressed. FIG. 7 illustrates how signals are exchanged in the probing apparatus when the pin electronics 13 shown in FIG. 6 are employed.

The pattern generator is formed as one VLSI, with a clock circuit integrated. The pattern generator 16 is electrically connected to the pin electronics 13 through the electronic pads 18C of the package 18. On the basis of the instruction signals from the tester T, the pattern generator 16 generates test pattern signals corresponding to the timing of the clock circuit. The test pattern signals are transmitted to the pin electronics 13. The pattern generator 16 can be formed as an MCM, like the pin electronics 13.

As shown in FIGS. 2 and 8A, the contactor 11 is detachably held by a holding mechanism 19, which is a disk-shaped frame. The contactor 11 can be integral with a frame 11D, as shown in FIGS. 8A and 8B. A seal member having a tongue-shaped cross section can be formed on the upper surface of the frame 11D, as shown in FIGS. 8A and 8B. The seal member 11E is in contact with the holding member 19. A plurality of positioning projections 11F, each having a conical tip end, are located outside of the seal member. By means of these positioning projections 11F, the contactor 11 is positioned with reference to the holding mechanism 19. The holding mechanism shown in FIG. 2 can be fabricated in a similar manner to that of FIGS. 8A and 8B.

As shown in FIG. 8A, the holding mechanism 19 is provided with a hole 19A. This hole 19A is located inside of the position where the seal member 11E is of the contactor 11 touches the holding mechanism 19, and is connected to an evacuating/exhausting mechanism (not shown). Through the hole 19A, the evacuating/exhausting mechanism exhausts air from the space that is inside of the position where the seal member 11E is in contact with the holding mechanism 19. By the suction force produced by the air exhaustion, the contactor 11 is adsorbed and held on the holding mechanism 19. At the time, the positioning projections 11F are fitted in holes 19B formed in the holding mechanism 19. The holding mechanism 19 is provided with a central hole 19C in the center thereof. Within this center hole 19C, the interposer (connection sheet) 12 is fitted. The interposer 12 is an interface between the contactor 11 and the pin electronics 13. The interposer 12 is, for example, a contactor having pogo-pins on both sides (i.e., a double-sided pogo contactor). Alternatively, it is an electronic connection member that allows current to flow in the direction orthogonal to the upper and lower surfaces thereof. When the contactor 11 is adsorbed and fixed inside the holding mechanism 19, it is electrically connected to the pin electronics 13 through the interposer 12. In FIGS. 8A and 8B, reference numeral 21 denotes a lock mechanism with which the contactor 11 is attached to the holding mechanism 19.

Where the contactor 11 is attached or detached with reference to the holding mechanism 19, an automatic contactor replacing mechanism, such as the one described in Japanese patent application No. 11-022985 filed by the applicant. The interposer 12 may be an anisotropic conductive sheet.

A description will now be given of the operation of the subject apparatus. First of all, the contactor 11 is set on the holding mechanism 19 by the automatic contactor replacing mechanism (not shown). As shown in FIGS. 8A and 8B, the seal member 11E of the contactor 11 is brought into contact with the holding mechanism 19. Under the control by the control section, the evacuating/exhausting mechanism is driven, and the pressure in the space inside of the seal member 11E is reduced. In this state, the contactor 11 is adsorbed and held on the holding mechanism 19, and is electrically connected to the pin electronics 13 through the interposer 12.

After the contactor 11 is set in the probing apparatus 10, a main chuck 31 (FIG. 1) holding a wafer W thereon is moved in such a manner that the wafer is aligned with the contactor 11. Thereafter, the electric characteristics of the wafer are inspected. When the main chuck is over-driven and the contactor 11 is brought into electric contact with the wafer, the pattern generator 16 generates a test pattern signal in response to an instruction from the tester T. This test pattern signal is sent to the pin electronics 13, as shown in FIG. 7. In the pin electronics 13, the driver section sends the test pattern signal to the contactor 11 under the control by the control section.

It should be noted that the driver section generates heat. According to the present embodiment, the pin electronics 13 is cooled directly by the cooling jacket 14, as shown in FIGS. 4A to 4C. Alternatively, the driver element 13A is directly cooled by the cooling jacket 14, as shown in FIGS. 5 and 6. In this manner, a temperature increase of the driver sections or driver element 13A of the pin electronics 13 is suppressed, adverse effects on the test are prevented. The transmission line of the pin electronics 13 is remarkably short in comparison with the that of the prior art, test pattern signals in a GHz band can be transmitted to the contactor 11 at high speed. The contactor 11 sends the test pattern signals to devices through the probes 11B, or receives test result pattern signals from the device. The test result pattern signals are supplied to the comparator section of the pin electronics 13 through the interposer 12. By comparing the test result pattern signals with a reference pattern signal, the comparator section determines whether the test result pattern signals are good or bad, i.e., whether the devices are non-defective or defective. Signals indicating the determination results are sent back to the tester T.

Since the distal end portion of the contactor 11 has a length not more than 3 mm, a failure in impedance matching at this portion does not result in significant distortion on the test pattern signals and test result pattern signals. These signals can be transmitted or received accurately.

As described above, according to the present embodiment, the electronic circuits of the pin electronics 13 are formed of one or more integrated circuits. The pin electronics 13 and the contactor 11 are electrically connected together by way of the interposer 12, and the cooling jacket 14 is provided to cool the pin electronics 13. Owing to this structure, the transmission line of the pin electronics can be as short as possible, and the test pattern signals and the test result pattern signals that are adapted for high-speed devices of a GHz band, can be transmitted with accuracy and at high speed. Since the pin electronics 13 is cooled by the cooling jacket 14, highly reliable inspection can be continued for a long time. Although the contactor 11 and the interposer 12 are hard to match in impedance, the transmission line between them is short. Accordingly, the test pattern signals and the test result pattern signals can be transmitted or received with high accuracy and precision.

The probing apparatus according to the present embodiment comprises: a contactor 11; pin electronics 13 having electronic circuits that are formed of at lest one integrated circuit; an interposer 12 for connecting the contactor 11 and the pin electronics 13 together; a cooling jacket 14 for cooling the pin electronics 13; and a pattern generator 16 connected to the pin electronics 13 through an interface board 15 and formed of one integrated circuit. With this structure, the transmission line between the pattern generator 16 and the pin electronics 13 is short, thus enabling the test pattern signals to be exchanged with high accuracy and precision and at high speed.

According to the present embodiment, the driver sections of the pin electronics 13 are formed as one driver element 13A and are separated from the other circuit sections, and this driver element 13a is cooled by the cooling jacket 14. Hence, the driver sections, which generate heat, are effectively cooled, it is possible to suppress the thermal effects on the other portions of the pin electronics 13.

According to the present embodiment, the comparator section of the pin electronics is separated from the other portions as a comparator element 13C, and this comparator element 13C is provided for the interposer 12. With this structure, the high-speed transmission line between the comparator element 13C and the contactor 11 is short. Even if the comparator element 13C is not matched in impedance to the probes 11B, the adverse effects (such as noise) on the test pattern signals can be suppressed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A high-speed measurement probing apparatus for inspecting electric characteristics of an object under inspection, comprising:

a probing apparatus main body;

a contactor arranged inside the probe apparatus main body, said contactor being replaceable;

a pin electronics including a plurality of electronic circuits and arranged in a transmission line that is provided for transmission of inspection signals between the contactor and a tester located outside the probing apparatus, said electronic circuits being made of at least one integrated circuit;

an interposer for electrically connecting the pin electronics and the contactor together, said interposer being replaceable; and cooling means for cooling the pin electronics.

2. A high-speed measurement probing apparatus according to claim 1, wherein the electronic circuits of the pin electronics include a control section, a comparator section and a driver section, and said control section, said comparator section and said driver section are made of at least one integrated circuit.

3. A high-speed measurement probing apparatus according to claim 1, wherein said pin electronics comprise an upper package and a lower package, and said cooling means is arranged between peripheral portions of the upper and lower packages.

4. A high-speed measurement probing apparatus according to claim 1, wherein said interposer includes contact pins that are projected from both sides thereof.

5. A high-speed measurement probing apparatus according to claim 2, wherein the driver section of the pin electronics is made of at least one integrated circuit and is located closer to the cooling means than other circuit sections.

6. A high-speed measurement probing apparatus according to claim 2, wherein the comparator section of the pin electronics is made of at least one integrated circuit and is located closer to the interposer than other circuit sections.

7. A high-speed measurement probe apparatus for inspecting electric characteristics of an object under inspection, comprising:

a probing apparatus main body;

a contactor arranged inside the probing apparatus main body, said contactor being replaceable;

a pin electronics including a plurality of electronic circuits and arranged in a transmission line that is provided for transmission of inspection signals between the contactor and a tester located outside the probing apparatus, said electronic circuits being made of at least one integrated circuit;

a pattern generator including an electronic circuit and used for generating inspection signals;

an interface board for electrically connecting the pattern generator and the pin electronics together;

an interposer for electrically connecting the pin electronics and the contactor together, said interposer being replaceable; and cooling means for cooling the pin electronics.

8. A high-speed measurement probing apparatus according to claim 7, wherein the electronic circuit of the pattern generator is made of at least one integrated circuit.

9. A high-speed measurement probing apparatus according to claim 7, wherein the electronic circuits of the pin electronics include a control section, a comparator section and a driver section, and said control section, said comparator section, and said driver section are made of at least one integrated circuit.

10. A high-speed measurement probing apparatus according to claim 7, wherein the driver section of the pin electronics is made of at least one integrated circuit and is located closer to the cooling means than other circuit sections.

11. A high-speed measurement probing apparatus according to claim 9, wherein the comparator section of the pin electronics is made of at least one integrated circuit and is located closer to the interposer than other circuit sections.

* * * * *